United States Patent [19]

Nagasaki et al.

[11] Patent Number: 5,307,169
[45] Date of Patent: Apr. 26, 1994

[54] SOLID-STATE IMAGING DEVICE USING HIGH RELATIVE DIELECTRIC CONSTANT MATERIAL AS INSULATING FILM

[75] Inventors: Tatsuo Nagasaki, Yokohama; Takeshi Mori, Tokyo; Hideo Adachi, Iruma, all of Japan

[73] Assignee: Olympus Optical Co., Ltd., Tokyo, Japan

[21] Appl. No.: 878,855

[22] Filed: May 5, 1992

[30] Foreign Application Priority Data

May 7, 1991 [JP] Japan .................................. 3-101579
Oct. 25, 1991 [JP] Japan .................................. 3-279661

[51] Int. Cl.$^5$ .............................................. H04N 5/335
[52] U.S. Cl. .................................. 348/307; 257/233; 257/295; 257/292; 257/310; 257/443; 348/308; 348/300
[58] Field of Search ............... 358/213.11, 213.13, 358/209; 257/290, 291, 443, 295, 310, 292, 222, 223, 225, 229, 230, 231, 332, 233; H04N 5/335

[56] References Cited

U.S. PATENT DOCUMENTS

| | | | |
|---|---|---|---|
| 4,173,765 | 11/1979 | Heald et al. | 357/23 |
| 4,860,076 | 8/1989 | Tabei et al. | 357/30 |
| 4,878,120 | 10/1989 | Matsumoto et al. | 358/213.12 |
| 4,926,247 | 5/1990 | Nagasaki et al. | 358/43 |
| 4,951,105 | 8/1990 | Yamada | 357/30 |
| 4,977,090 | 12/1990 | Shimada et al. | 437/2 |
| 5,124,777 | 6/1992 | Lee | 357/51 |

FOREIGN PATENT DOCUMENTS

3938302A1 5/1990 Fed. Rep. of Germany .......... H04N 7/15

OTHER PUBLICATIONS

IEEE Transactions on Electron Devices, vol. 37, No. 10, Oct. 1990; pp. 2201–2206; "Ferroelectric Liquid--Crystal Shutter Array with a-Si:H TFT Driver"; Okumura et al.
Electronics, Sep. 1989; pp. 61–63; "Technology The Wild Card"; B. Cole.

Primary Examiner—Joseph Mancuso
Assistant Examiner—Tuan V. Ho
Attorney, Agent, or Firm—Frishauf, Holtz, Goodman & Woodward

[57] ABSTRACT

A solid-state imaging device comprises a semiconductor substrate, a plurality of pixels formed on the semiconductor substrate and generating imaging signals, and an output amplifier converting a pixel signal generated from the pixel to an imaging signal, and outputting the image signal. The pixel includes a photoelectric converting portion generating a charge in accordance with the amount of received light, a capacitor storing a charge generated from the photoelectric converting portion, and a switching portion for reading out the charge stored in the capacitor as the pixel signal. The capacitor includes a storing region formed on at least one of a part or an adjacent portion of the photoelectric converting portion, a capacitor insulating film formed on the storing region, the capacitor insulating film being made of a high dielectric material having a high relative dielectric constant, and a capacitor electrode formed on the capacitor insulating film.

26 Claims, 9 Drawing Sheets

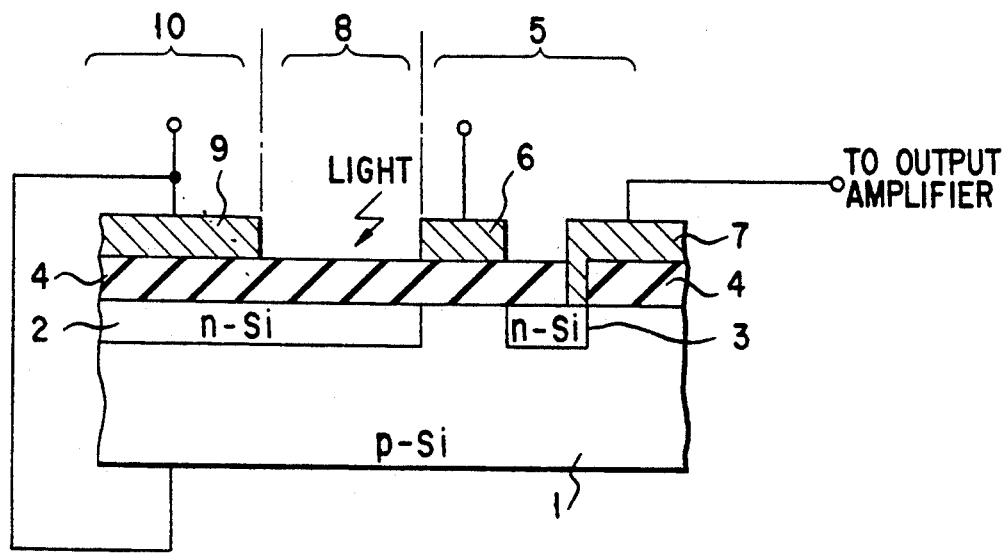
F I G. 1
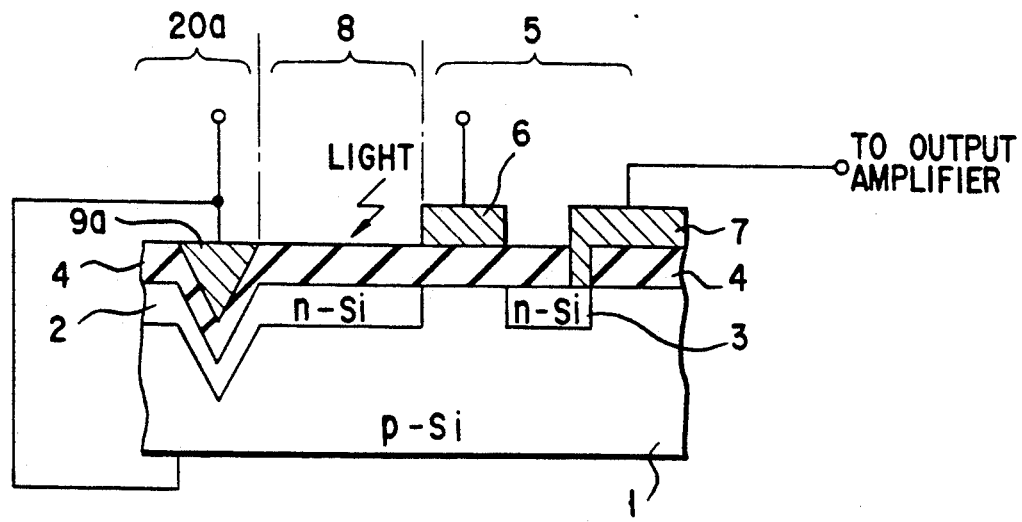
F I G. 2

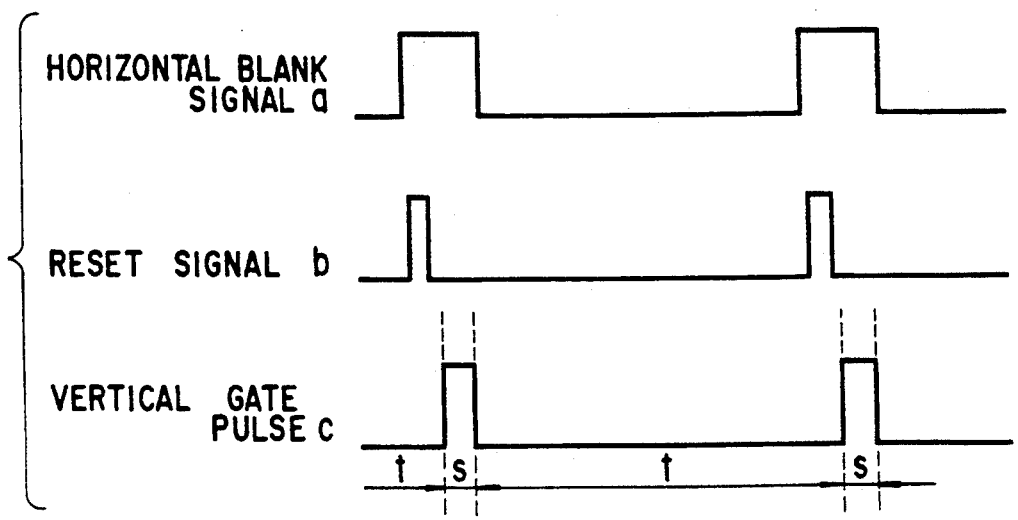
F I G. 8
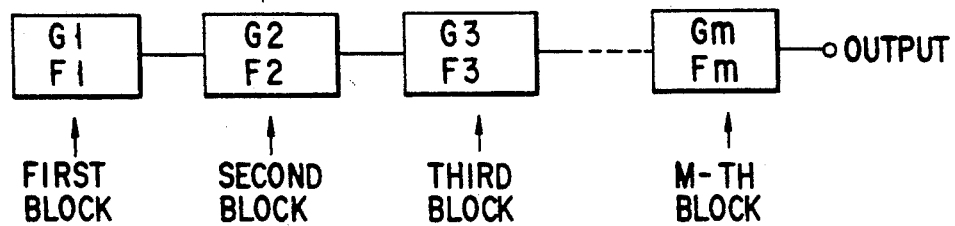
F I G. 9

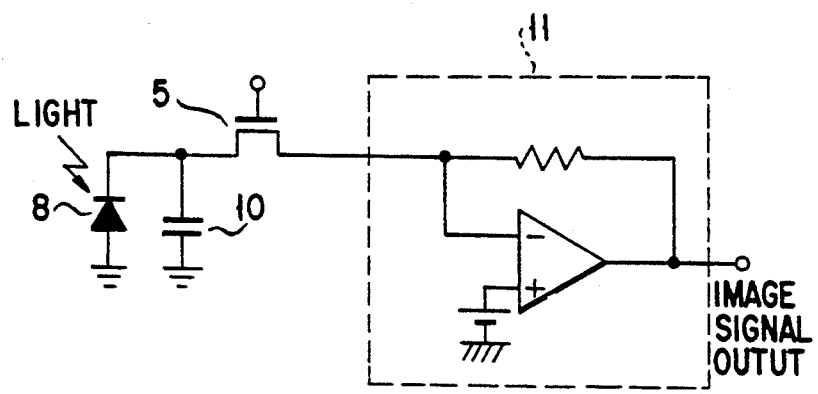
F I G. 16
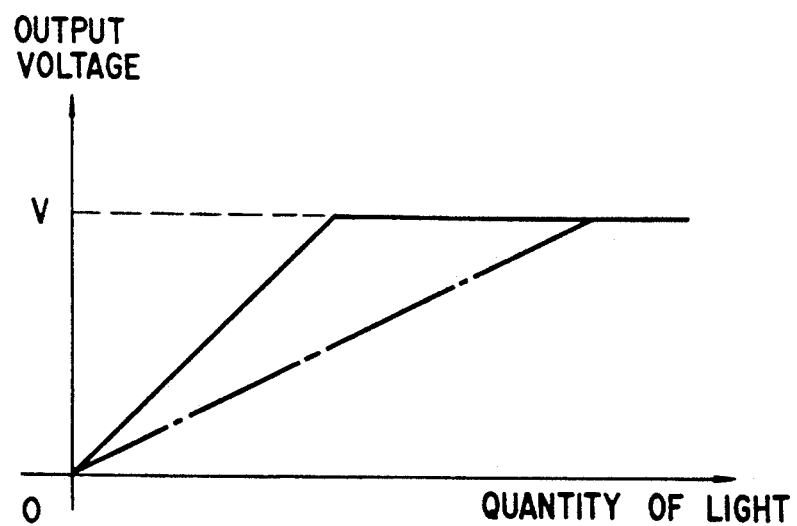
F I G. 17

SOLID-STATE IMAGING DEVICE USING HIGH RELATIVE DIELECTRIC CONSTANT MATERIAL AS INSULATING FILM

BACKGROUND OF THE INVENTION

1. Field of the Invention

This invention relates to a solid-state imaging device used in the field of imaging techniques and the field of measuring instruments and applied to, for example, an XY-address type MOS imaging element.

2. Description of the Related Art

In a solid-state imaging device for converting an image of an object to an electrical imaging signal, a dynamic range is increased in order to cope with various objects having a wide luminance distribution.

A device for increasing the dynamic range of the solid-state imaging device is disclosed in Published Unexamined Japanese Patent Application (PUJPA) No. 63-232591. In a method for increasing the dynamic range disclosed in the above application, a plurality of images each obtaining a different exposure period are non-destructively read out from non-destructive readout imaging elements, and the plurality of images are added to each other on the outside of the imaging elements. Consequently, an image obtained from the plurality of images, has an increased dynamic range, and has wide luminance information from low luminance to high luminance.

However, when the dynamic range is increased by the above method, a driving circuit for successively changing the exposure period and a circuit for summing a plurality of images are required; the structure of the device becomes complex and the size of the element is increased.

SUMMARY OF THE INVENTION

The first object of the present invention is to provide a solid-state imaging device in which the capacity of one pixel can be increased and a dynamic range can be increased without a complex reading-out process or an image adding process.

The second object of the invention is to provide a solid-state imaging device in which the capacity of one pixel can be increased and a dynamic range can be increased without influencing the S/N ratio or the reliability.

According to one aspect of the present invention, a solid-state imaging device comprises a semiconductor substrate, a plurality of pixels formed on the semiconductor substrate and generating pixel signals, and an output amplifier for converting the pixel signals generated from the above mentioned pixels to imaging signals and for outputting the image signals.

The pixel includes a photoelectric converting portion for generating a charge in accordance with an amount of received light, a capacitor for storing the charge generated from the photoelectric converting portion, and a switching portion for reading out the charge stored in the capacitor as the pixel signal.

The capacitor includes a storing region formed on a part or an adjacent portion of the photoelectric portion a capacitor insulating layer formed on the storing region, the layer made of a high dielectric material having a high relative dielectric constant, and a capacitor electrode provided in contact with insulating layer so as to supply a fixed potential to the capacitor insulating layer.

In the XY address-type solid-state imaging device of the present invention, a plurality of pixels are arranged in a matrix in the first and second directions. The solid-state imaging device comprises a plurality of horizontal selecting lines connected to a plurality of pixels which form a plurality of rows in the first direction, a plurality of vertical selecting lines connected to the pixels which form a plurality of rows in the second direction, a pixel addressing circuit for addressing a specific pixel by applying a read-out signal to the horizontal and vertical selecting lines, and reading the pixel signal from the addressed pixel, and a line capacitor formed on said vertical line, having a line capacitor insulator made of a high dielectric material having a high relative dielectric constant, and storing a pixel signal read out from the capacitor.

According to a solid-state imaging device of the present invention, a capacitor insulating layer made of the high dielectric material is used for the capacitor formed on the pixel, and the charge generated from the photoelectric converting portion is stored in the capacitor in order. Since this capacitor has a high relative dielectric constant, its capacity can be increased as compared with a conventional material, such as $SiO_2$, etc. Therefore, the capacity of the pixel can be increased and the dynamic range can also be increased without adding images.

According to another aspect of the invention, the capacitor storing the charge generated from the photoelectric converting portion of the pixel, and the line capacitor storing a pixel signal read out from the capacitor of the pixel, each have a high relative dielectric constant, and it is possible to increase the capacity of the pixel and the dynamic range without adding images.

In the present invention, in more detail, since the pixel signal read out from the pixel is amplified by means of a static-induced-transistor having a source follower structure and a MOS transistor, it is possible to obtain an image signal wherein the ratio S/N has been improved.

The principle for increasing the pixel capacity by using a high dielectric material for the above mentioned capacitor insulating layer will now be described.

When the quantity of charge stored in a capacitor is Q, the capacity of the capacitor is C, and the applied voltage is V, it is generally known that an expression of the relation between Q and C becomes $Q = CV$. In order to increase the quantity of the stored charge "Q", it is necessary to increase the capacity "C". The capacity "Co" per unit area of the capacity "C" is expressed as the following equation:

$$Co = (\epsilon r \cdot \epsilon o)/Xo \qquad (1)$$

"$\epsilon r$" denotes the relative dielectric constant of $SiO_2$ which is an insulating oxide film, "$\epsilon o$" denotes the relative dielectric constant in a vacuum, and "X" denotes the thickness of oxide film $SiO_2$.

A general MOS type imaging element use $SiO_2$ for an insulating oxide film; therefore, the capacity "Co" per unit area is described in equation (1). In order to increase the capacity "Co", it is better to use a material which has large relative dielectric constant "$\epsilon r$" from equation (1).

The photoelectric converting property of an element whose capacity is increased is shown in FIG. 17. The photoelectric converting property of a normal MOS type imaging element is shown by a full line, and that of MOS type imaging element, whose capacity is increased, is shown by a dash-and-dot line. That is, a saturation level can be raised by increasing the capacity.

Generally, the relative dielectric constant of the insulating film which is used as a capacitor insulating layer is described as the following Table 1:

TABLE 1

| Insulating Layer | Relative | Dielectric Constant | |
|---|---|---|---|
| $SiO_2$ | 4.5 | dielectric substance | low dielectric material |
| $Si_3N_4$ | 10 | dielectric substance | low dielectric material |
| $Ta_2O_5$ | 22 | dielectric substance | high dielectric material |
| $Pb(Mg_{0.5}W_{0.5})O_3$ | 100 | antiferroelectric substance | high dielectric material |
| $TiO_2$(rutile) | 130 | dielectric substance | high dielectric material |
| $PbZrO_3$ | 150 | antiferroelectric substance | high dielectric material |
| $SrTiO_3$ | 300 | dielectric substance | high dielectric material |
| PZT | 1000 | ferroelectric substance | high dielectric material |
| $BaTiO_3$ | 2000 | ferroelectric substance | high dielectric material |

In the present embodiment, a dielectric substance having relative dielectric constant of 20 or less is termed a low dielectric material, and a dielectric substance having relative dielectric constant of 20 or more a high dielectric material. This high dielectric material includes antiferroelectrics, $Pb(Mg_{0.5}W_{0.5})O_3$, and $PbZrO_3$, ferroelectrics, PZT, and $BaTiO_3$, and dielectrics (though neither ferroelectrics nor antiferroelectrics), $Ta_2O_5$, $TiO_2$, and $SrTiO_3$, etc.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 shows a cross-sectional view of one pixel of the solid-state imaging device of a first embodiment;

FIG. 2 shows a first modification of the structure of the pixel, the structure of the capacitor being modified;

FIG. 8 shows charge transfer operation timing in the solid-state imaging device relating the second embodiment;

FIG. 9 illustrates a principle of reducing the noise coefficient;

FIG. 16 shows an equivalent circuit of the pixel shown in FIG. 1; and

FIG. 17 shows a photoelectric converting characteristic of each pixel.

DETAILED DESCRIPTION OFT HE PREFERRED EMBODIMENTS

Figure 3:
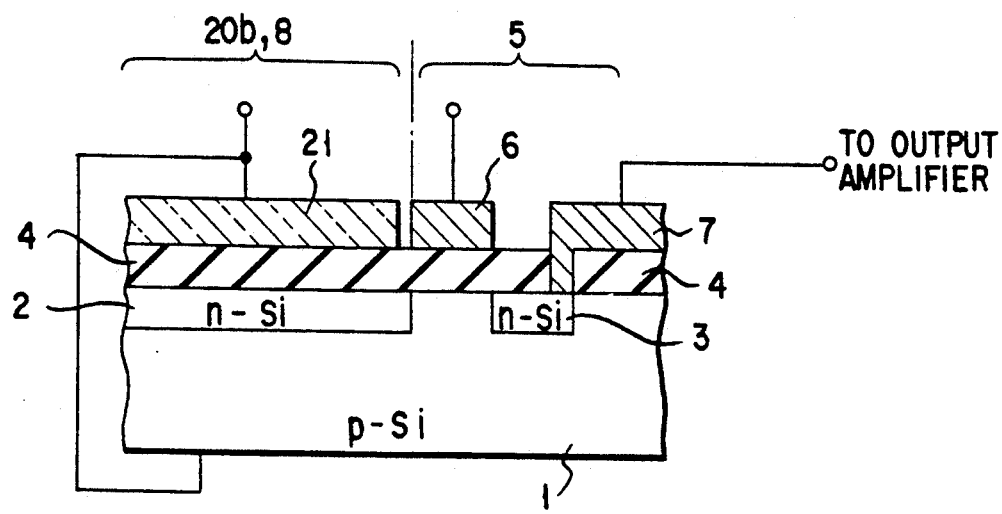
FIG. 3 shows a second modification of the structure of the pixel, a transparent electrode being used for a capacitor electrode.

Embodiments of the present invention will now be described.

A MOS type solid-state imaging device according to a first embodiment of the present invention will now be described with reference to FIG. 1. FIG. 1 shows a cross-sectional structure of one pixel in the MOS type solid-state imaging device.

The imaging device of this embodiment comprises a silicon substrate, a plurality of pixels which are separated from each other and arranged on the silicon substrate like a matrix, a plurality of XY-selection lines respectively connected to pixels arranged in the X direction and Y direction, vertical and horizontal transferring switches for selecting a pixel by applying a selected pulse to an of XY-selection lines and transferring a pixel signal read out from the selected pixel, and an output amplifier for converting a pixel signal transferred by means of the vertical and horizontal transferring switches to an imaging signal.

The structure of one pixel will be described in detail with reference to FIG. 1.

Reference numeral 1 in FIG. 1 denotes a p-type silicon substrate. MOS transistor 5, photodiode 8, and capacitor 10 are formed in the region of such a pixel of silicon substrate 1.

N-type source region 2 and drain region 3 are separately formed on the surface of silicon substrate 1. An insulating film 4 made of a high dielectric material is formed on substrate 1. On insulating film 4 between source region 2 and drain region 3, gate electrode 6 of MOS transistor 5 for turning on/off the portion between source region 2 and drain region 3 is formed. A part of insulating film 4 positioned on drain region 3 is opened. Drain electrode 7 is formed so as to contact with the drain region 3 through this opening portion.

A part of the upper surface of insulating film 4 formed on source region 2 is a light receiving surface. Source region 2 and substrate 1 situated under the light receiving surface comprise a photodiode 8.

Capacitor electrode 9 made of polycrystalline silicone at the region adjacent to the above-mentioned light receiving surface is provided on the upper surface of insulating film 4 formed on source region 2. Capacitor electrode 9, capacitor insulating film 4 (a part of insulating film 4), and source region 2 positioned under this capacitor electrode 1 comprise the above mentioned capacitor 10.

FIG. 16 shows an equivalent circuit of one pixel of a solid-state imaging device having such a structure. Drain electrode 7 of MOS transistor 5 is connected to output amplifier 11. This output amplifier 11 outputs a pixel signal made of the charge stored in the capacitor 10 of the pixel, out of an element, as an imaging signal by current-voltage conversion.

An operation of this embodiment having the above structure will now be described.

When light incident on a light receiving surface of photodiode 8, a charge, whose amount depends on the amount of light received in photodiode 8, generates and is stored in the capacitor 10. In this case, the potential is supplied from the outside to capacitor electrode 9 so that a fixed potential is supplied to capacitor insulating layer 4, and the potential of capacitor electrode 9 and the potential of silicon substrate 1 are kept the same as the above supplied potential. In the present embodiment, capacitor electrode 9 is provided on capacitor insulating layer 4. However, it is also possible to provide capacitor electrode 9 on the side portion of capacitor insulating layer 4 so as to come in contact with capacitor insulating layer 4.

When a selection pulse is applied simultaneously to gate electrode 6 from a XY-selection line, a gate of MOS transistor 5 is switched on. Consequently, the charge stored in capacitor 10 is read out from drain electrode 7 as a pixel signal. After this read-out pixel signal is transferred, as synchronized with another pixel, by means of the vertical and horizontal transferring switches, the signal is input into output amplifier 11. Then, it is output out of the element as a current-voltage converted imaging signal.

In this embodiment, a high dielectric constant material is used for capacitor insulating film 4 of capacitor 10 which is formed adjacent to photodiode 8. Therefore, the capacity of capacitor 10 can be increased. Since a charge generated in photodiode 8 is stored in such a capacitor 10, the capacity of pixels can also be increased. As a result, the dynamic range can be increased and the structure of the element can be simplified without a driving circuit for changing an exposure period or a memory for adding a plurality of pixels.

The relative dielectric constant of the capacitor insulating film made of a high relative dielectric constant material is tens to hundreds times, compared with the relative dielectric constant of $SiO_2$ used as a conventional capacitor insulating film. Therefore, the storing capacity of capacitor 10 is increased in relation to the above mentioned dielectric constant.

In the first embodiment, a high dielectric substance is used for a capacitor insulating film. The high dielectric material may be a ferroelectric substance, for example, PZT having pyroelectricity or piezoelectricity.

Pyroelectricity is the phenomenon wherein when temperature of a solid material is changed, a charge is generated in electrodes which sandwich the solid material. The greater this effect, the thinner the material. Moreover, when light is traveled/shut down, the light is converted into heat in the material, and a charge is generated on the electrode. This is a thermal effect and has an operation without wavelength properties from ultraviolet to infrared.

Specifically, when light enters a gate unit of a MOS transistor, a charge is generated not only by the photoelectric effect, but also by pyroelectric effect, if a ferroelectric capacitor unit is situated right down or near the gate electrode for storing charges. Generation of such a pyroelectric charge is not preferable since it becomes a noise source to an input imaging signal.

Piezoelectricity is a phenomenon wherein when stress change, vibration, or an acoustic wave is applied to a solid material, a charge is generated in electrodes which sandwich the solid material. If the piezoelectric effect is operated, the charge becomes a noise source to an input imaging signal, like the pyroelectric effect.

Moreover, a reverse piezoelectric effect occurs inseparably from the piezoelectric effect, and the following disadvantages arise. When the amount of charge Q generated by a photoelectric effect by means of incidence light is stored in the ferroelectric capacitor, voltage $V=Q/C$ is generated between electrodes of this ferro-electric capacitor. (Symbol C is an electric capacity of the ferroelectric capacitor.) This voltage V causes fatigue of the element by generating distortion in the ferroelectric capacitor by the reverse piezoelectric effect.

As stated above, when the ferroelectric capacitor is used for a charge storing unit, it is possible to increase the dynamic range of an XY-address type imaging element, such as a MOS imaging element etc. by using its high dielectric-constant. At the same time, however, there occurs new problems, such as the ratio of S/N becomes worse and the reliability becomes worse.

Figure 14:
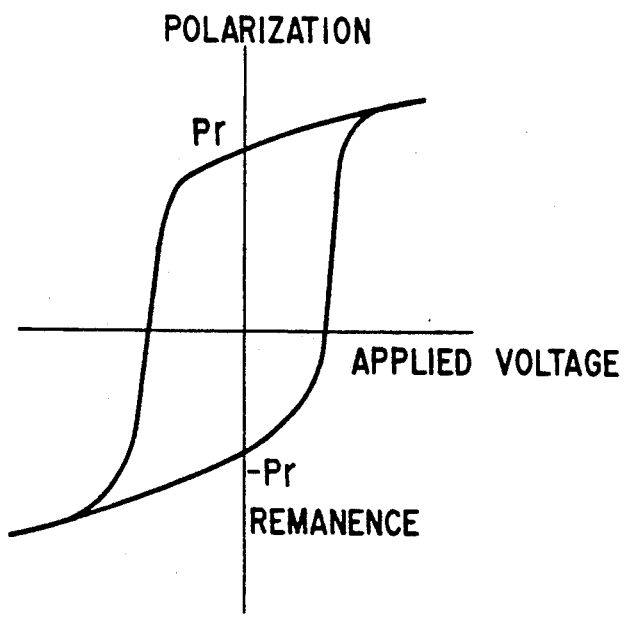
FIG. 14 shows a polarization-impressed voltage characteristics of ferroelectrics.
Figure 15:
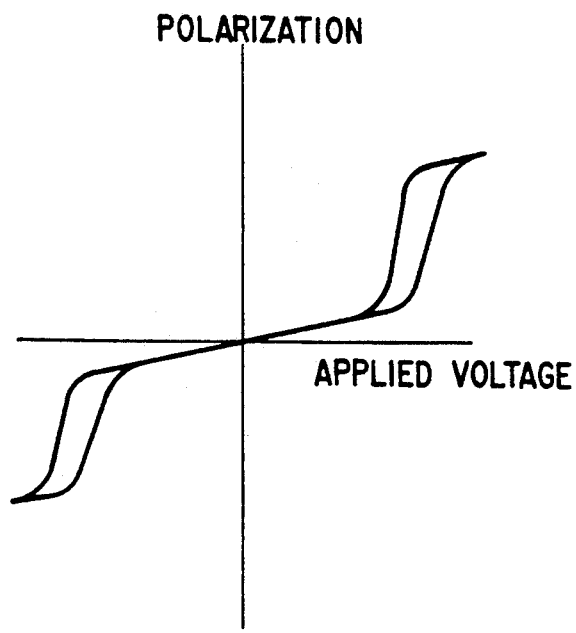
FIG. 15 shows a view describing polarization-impressed voltage characteristics of antiferroelectrics.

FIG. 14 shows polarization/impressed voltage properties (hysteresis properties) of a ferroelectrics like PZT having pyroelectricity and piezoelectricity. FIG. 15 shows polarization/impressed voltage properties of antiferroelectrics (hysteresis properties).

These are different from each other in the existence of remanence Pr. The photoelectric effect causes the change of remanence Pr in accordance with the change of temperature. The piezoelectric effect causes the change of remanence Pr on the basis of stress. On the other hand, since the antiferroelectrics do not have spontaneous polarization, it has neither a photoelectric effect nor a piezoelectric effect.

When a high electric field is applied to the antiferroelectrics, the antiferroelectrics causes phase transition to a ferroelectric phase while the high electric field is applied. In this case, it shows the photoelectric effect and piezoelectric effect in the state wherein a bias voltage is applied. Unless the bias voltage is not applied, the phase transition to the ferroelectric phase does not occur.

Therefore, it is preferable to use anti-ferroelectric substance, dielectric substance a (without low dielectric material), and ferroelectrics which do not have a remanence property as a high dielectric used for a capacitor insulating film. By using such a preferable high dielectric material as a capacitor insulating film, it is possible to obtain advantages wherein the dynamic range is increased and the structure of the element is simplified, without causing disadvantages obtained from the above-mentioned photoelectric effect and piezoelectric effect, i.e. without deteriorating the ratio of S/N of an image signal.

Modifications relating to the structure of the capacitor will now be described with reference to FIGS. 2 to 4.

FIG. 2 shows a first modification relating to the pixel structure. Since this modification is different from the above first embodiment only in the structure of the capacitor, the same reference numerals will be used to denote the other common portions and a detailed description will now be omitted. This is applicable to the other modifications.

In the present modification, a V-shaped groove is formed in silicon substrate 1. Capacitor 20a formed by using capacitor insulating film 4 made of a high dielectric material is formed in the V-shaped groove. Capacitor 20a is formed so as to fill the groove of capacitor insulating film 4.

In this modification, it is possible to reduce the ratio of the area of capacitor electrode 9a on insulating film 4; therefore, it is possible to overcome the lowering of the opening ratio of the receiving surface. Moreover, since a large charge-storing-area can be obtained from a small plain area, the size of the element can be decreased.

FIG. 3 shows a second modification relating to the pixel structure.

In the present modification, transparent electrode 21 is formed as a capacitor electrode of capacitor 20b.

In this modification, since light passes through transparent electrode 21, the lowering of the opening ratio of the light receiving portion can be prevented, without the V-shaped structure shown in FIG. 2.

Figure 4:
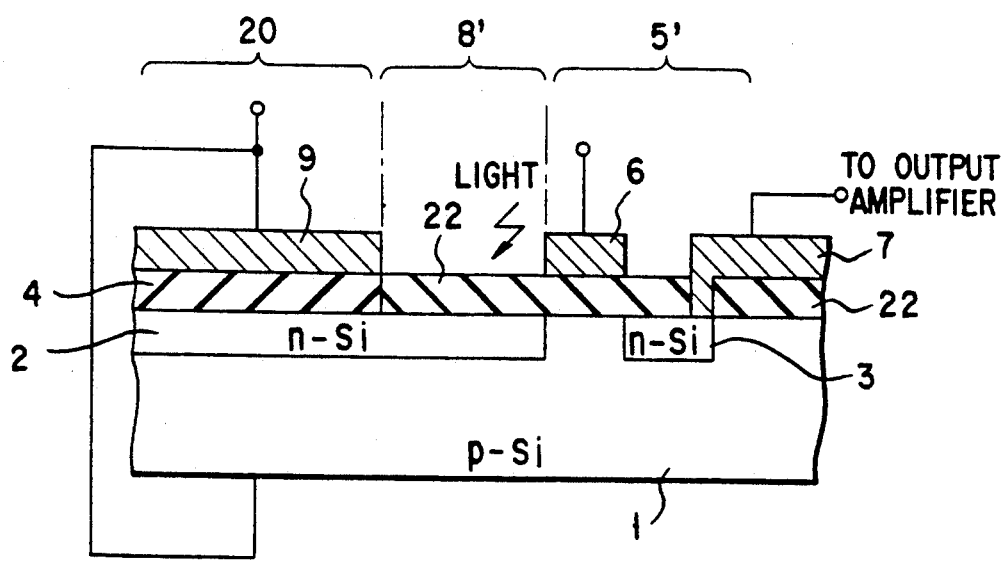
FIG. 4 shows a third modification of the structure of the pixel, an oxide film being used to an insulating film of a photodiode and a switching element.

FIG. 4 shows a third modification relating to the pixel structure.

A high dielectric material is used only for capacitor insulating film 4 of capacitor 20, and oxide film 22 made of $SiO_2$ is used for an insulating film of each of MOS transistor 5' and photodiode 8'.

Figure 5:
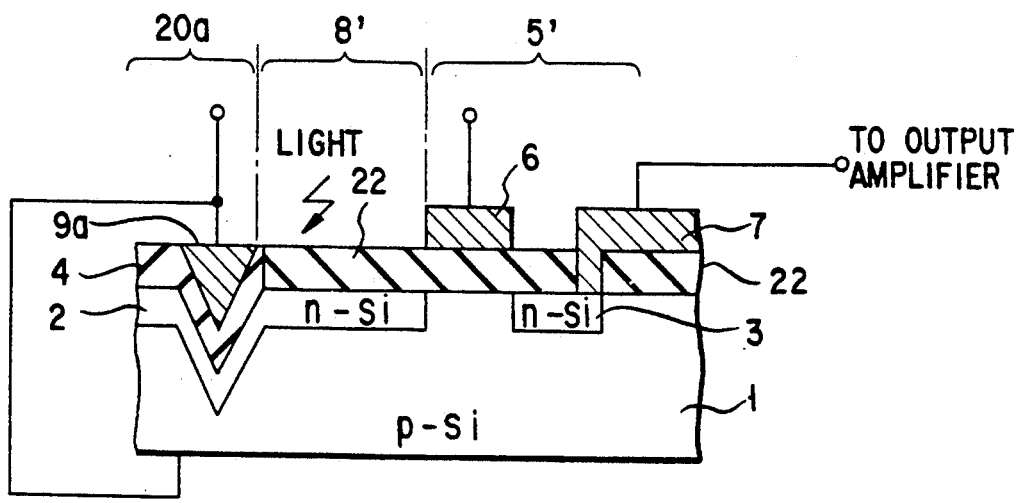
FIG. 5 shows a fourth modification of the structure of the pixel, the structure of the capacitor being changed and the oxide film being used for the insulating film of the photodiode and the switching element.

FIG. 5 shows a fourth modification relating to the pixel structure.

A high dielectric material is used only for capacitor insulating film 4 of V-shaped capacitor 20a, and oxide film 22 made of $SiO_2$ is used for an insulating film of each of MOS transistor 5' and photodiode 8'.

Figure 6:
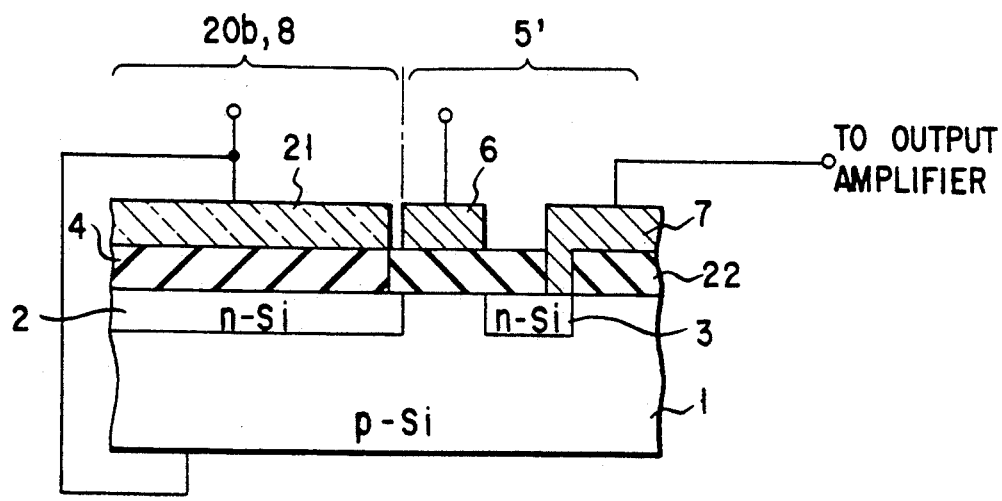
FIG. 6 shows a fifth modification of the structure of the pixel, the transparent electrode being used for the capacitor electrode, and the oxide film being used for the insulating film of the photodiode or the switch element.

FIG. 6 shows a fifth modification relating to the pixel structure.

Transparent electrode 21 is formed as a capacitor electrode of capacitor 20b, and oxide film 22 made of $SiO_2$ is used for the insulating film of MOS transistor 5'.

A second embodiment of the present invention will now be described.

Figure 7:
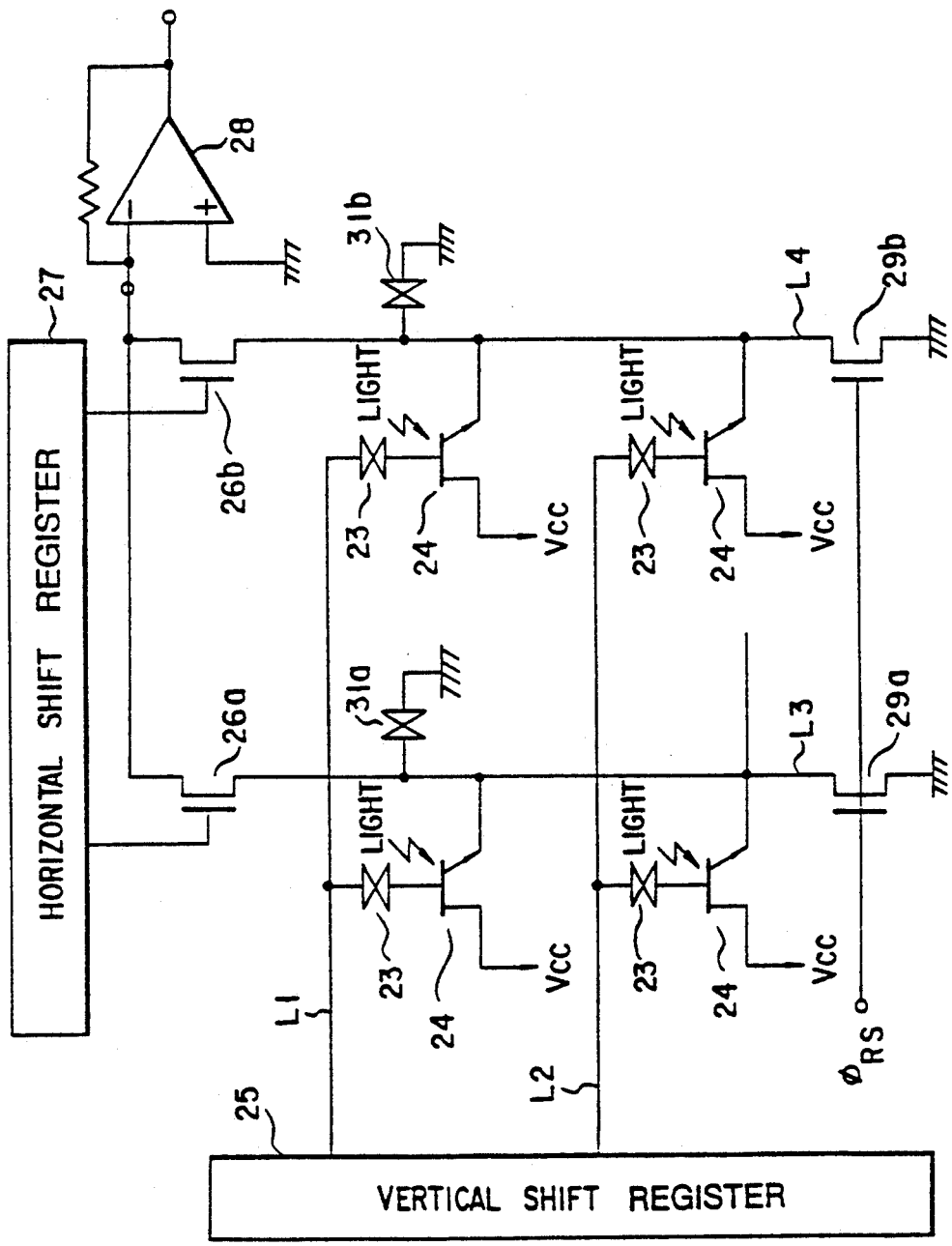
FIG. 7 shows a circuit structural view of a solid-state imaging device relating to a second embodiment of the present invention.

FIG. 7 shows a circuit structure of an XY-address type solid-state imaging device relating to the second embodiment of the present invention. This embodiment comprises a plurality of pixels arranged in a matrix (representative four pixels are described in FIG. 7), the above pixels comprising a photoelectric transfer element, SIT (Static Induced Transistor) 24 of the source follower structure having both functions, a read-out switch, and pixel-side capacitor 23 having a capacitor insulating film of a high dielectric material.

The above pixels are connected respectively to horizontal line L1 or L2 and vertical line L3 or L4. Each of line capacitors 31a and 31b having a capacitor insulating film of high dielectric material is provided in each of vertical lines L3 and L4.

One electrode of pixel-side capacitor 23 is connected to its corresponding horizontal line L1 or L2, and the other electrode is connected to its corresponding vertical line L3 or L4 through a gate-drain passage.

SIT 24 performs a function as a photoelectric converting element by using a pn-connection. Therefore, the photoelectric converting element is not shown in this figure.

One terminal of each of horizontal lines L1 and L2 is connected to vertical shift register 25. One terminal of each of horizontal lines L3 and L4 is connected to horizontal shift register 27 through a drain-gate passage of the corresponding MOS switches 26a and 26b. The other terminal of each of vertical lines L3 and L4 is connected to a drain of each of MOS switches 29a and 29b wherein a source of which is grounded.

Line capacitors 31a and 31b for using capacitor insulating films made of a high dielectric material are connected respectively to vertical lines L3 and L4.

The source side of each of MOS switches 26a and 26b is connected to output amplifier 28.

The operation of the present embodiment having such a structure will now be described.

In each pixel, a charge relative to the amount of input light occurs. The occurring charge is stored in corresponding pixel-side capacitor 23. The charge stored in capacitor 23 is read out by SIT 24 via a horizontal line selected by vertical shift register 25, and transferred to line capacitor 31a or 31b of vertical line L3 or L4.

A transferring operation of the pixel signal will be described in detail with reference to FIG. 8.

During the horizontal blanking period of the timing shown in FIG. 8, each line capacitor 31a, 31b is reset by a reset signal applied to MOS switches 29a and 29b. Then, vertical gate pulse c is applied to the gate of SIT 24 from vertical shift register 25. Consequently, a charge of one horizontal line among the charge stored in pixel-side capacitor 23 is current-amplified by SIT 24, and transferred into line capacitor 31a or 31b. Thereafter, the level of vertical gate pulse c falls and SIT 24 is turned off.

When the horizontal blanking period is terminated, a read-out pulse is applied to the gates of MOS switches 26a and 26b from horizontal shift register 27, and MOS switches are successively turned off at high speed. Consequently, the charge stored in line capacitors 31a and 31b is transferred to an output amplifier and converted into a voltage signal.

In the present embodiment, SIT 24 has the source follower structure by applying a voltage Vcc to the drain of SIT 24. Therefore, SIT 24 operates not only as a switch element, but also as a current amplification circuit.

Specifically, vertical gate pulse c is applied to the gate of SIT 24 at the timing shown in FIG. 8, so that SIT 24 operates as a source follower circuit. Then, the charge read out from pixel side capacitor 23 is current-amplified and stored in line capacitor 31a or 31b. The deterioration of the S/N ratio of the charge stored in the pixel is minimized for the following reason:

In a series circuit shown in FIG. 9, a gain in each block is Gm ("m" designates the order of blocks in a circuit system), and the noise coefficient in each block is Fm. In this case, total noise coefficient F in the system shows the following equation (2):

$$F=F1+(F2-1)/G1+(F3-1)/(G1 \cdot G2)+(Fm-1)/(G1 \cdot G2 \cdot G3 \ldots Gm_{-1}) \ldots \quad (21)$$

The noise coefficient is the value obtained by dividing the input signal S/N in each block by the output signal S/N.

According to equation (2), the noise coefficient in the entire circuit system is lowered by increasing the gain of the circuit block at the first stage. As clarified in the present embodiment, the charge of pixel side capacitor 23 is current-amplified by SIT 24 and transferred to line capacitor 31a or 31b which is a circuit system in the next stage, so that the deterioration of the S/N of the stored charge is minimized.

Since pixel-side capacitor 23 and line capacitor 31 use high dielectric material as an insulating film, the capacity of pixel-side capacitor 23 and line capacitor 31 is increased and loaded impedance is lowered. As a result, the rate of current amplification of SIT 24 is increased and the noise coefficient is decreased for the above reason.

In the charge stored in line capacitors 31a and 31b, thermal noise occurs by the on-resistance of MOS switch 26 selected by horizontal shift register 27.

As represented in the above equation (2), the deterioration of S/N caused by this noise can be disregarded. However, the occurring thermal noise is stored in line capacitor 31 when MOS switch 26 is opened (when the conducting is released). Since the capacity of line capacitor 31 is larger than that of pixel-side capacitor 23, line capacitor 31 stores large noise energy in relation to small light receiving signal. Then, when MOS switch 26 is closed after one horizontal period, the noise energy is superimposed on a horizontal line signal as noise.

In the present embodiment, MOS switch 29 is provided at the other end of vertical line L3 or L4. As shown in FIG. 8, during the horizontal blanking period, just before applying vertical gate pulse c for reading out a light receiving signal, reset pulse b is applied to MOS switch 29 to line capacitor 31 so as to leave the above thermal noise.

Moreover, thermal noise occurs from the conducting of MOS switch 29. In order to decrease the thermal noise, it is necessary to reduce the on-resistance. Moreover, in order to reduce the on-resistance, it is effective to enlarge the area of the gate of the MOS transistor. In the case of enlarging the gate area, the switching speed is lowered. In the present embodiment, however, it is possible to reset during the horizontal blanking period, so that the switching speed in the area of the gate which can fully suppress the thermal noise can be enough.

In this embodiment, the high dielectric material is used for capacitor insulating film of pixel-side capacitor 23 and line capacitor 31, and the charge of pixel-side capacitor 23 is current-amplified by SIT 24 having a source follower configuration and stored in line capacitor 31. Therefore, it is possible to increase the dynamic range of the imaging signal, reduce the noise coefficient, and output a signal of an improved S/N ratio.

At the first half of the horizontal blanking period, reset pulse b is applied to line capacitor 31 from MOS switch 29 just before applying vertical gate pulse c for reading out a light receiving signal. Therefore, a thermal noise occurring when closing MOS switch 26 can be eliminated.

In the above second embodiment, a source follower circuit is obtained by not only SIT, but also a MOS transistor. When the MOS transistor is used for the source follower circuit, it is necessary to provide a switch for resetting a charge stored in pixel-side capacitor 23.

Figure 10:
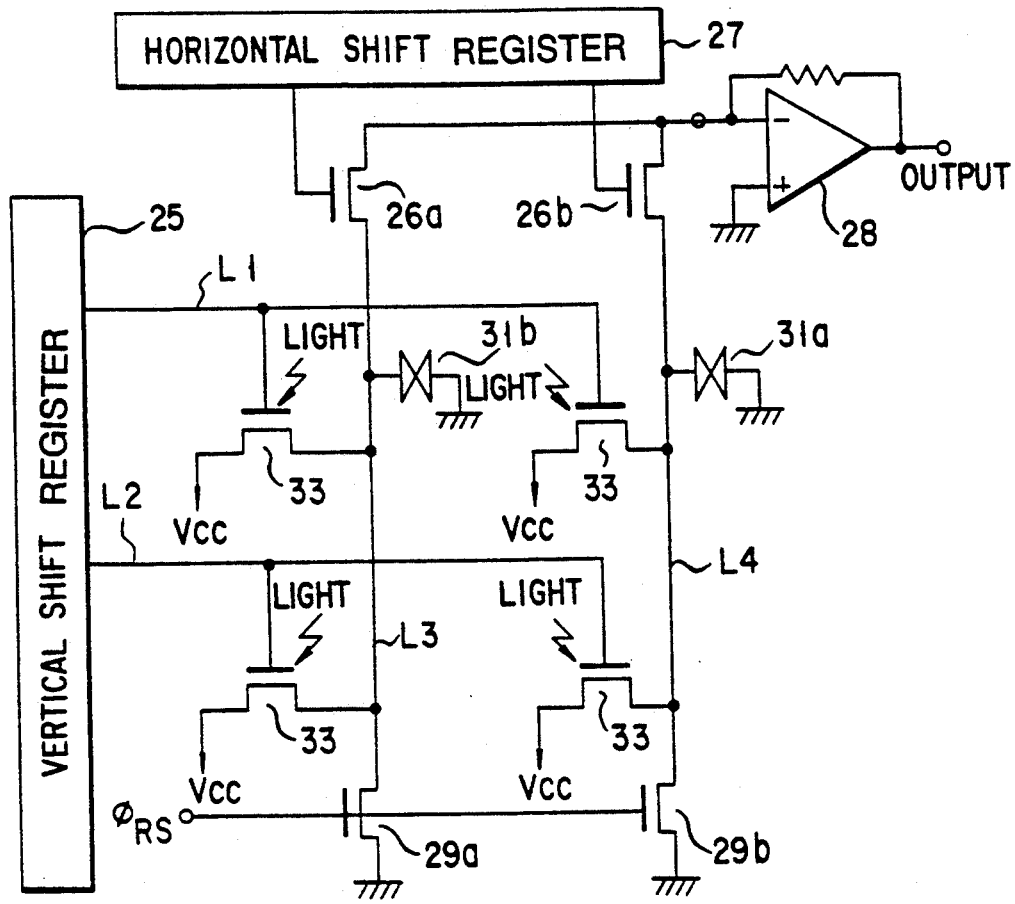
FIG. 10 shows a view of a modification relating the second embodiment.

FIG. 10 shows a modification of a solid-state imaging device using a MOS transistor in place of SIT 24.

Figure 11:
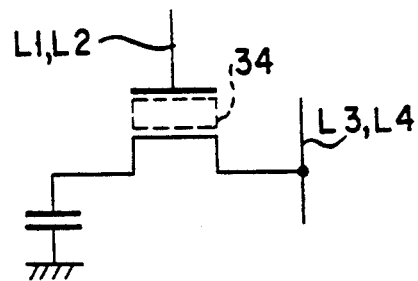
FIG. 11 shows a view of the structure of a MOS transistor used in the modification shown in FIG. 10.

In this modification like the above first embodiment, a light receiving portion and a storing portion are formed as a unitary body, and the source follower circuit is comprised of MOS transistor 33. As shown in FIG. 11, in MOS transistor 33, high dielectric 34 is used for a MOS-type oxide film portion, so that the light receiving portion and the storing portion are formed as a unitary body. Moreover, as stated above, MOS transistor 33 requires a reset switch, which is not shown in FIG. 10.

In such a modification, the noise coefficient can be reduced and the S/N ratio can be improved by the same operation as the second embodiment.

A third embodiment will now be described with reference to FIG. 12.

This embodiment relates to an image storing device named as a Charge Modulation Device (CMD).

Figure 12:
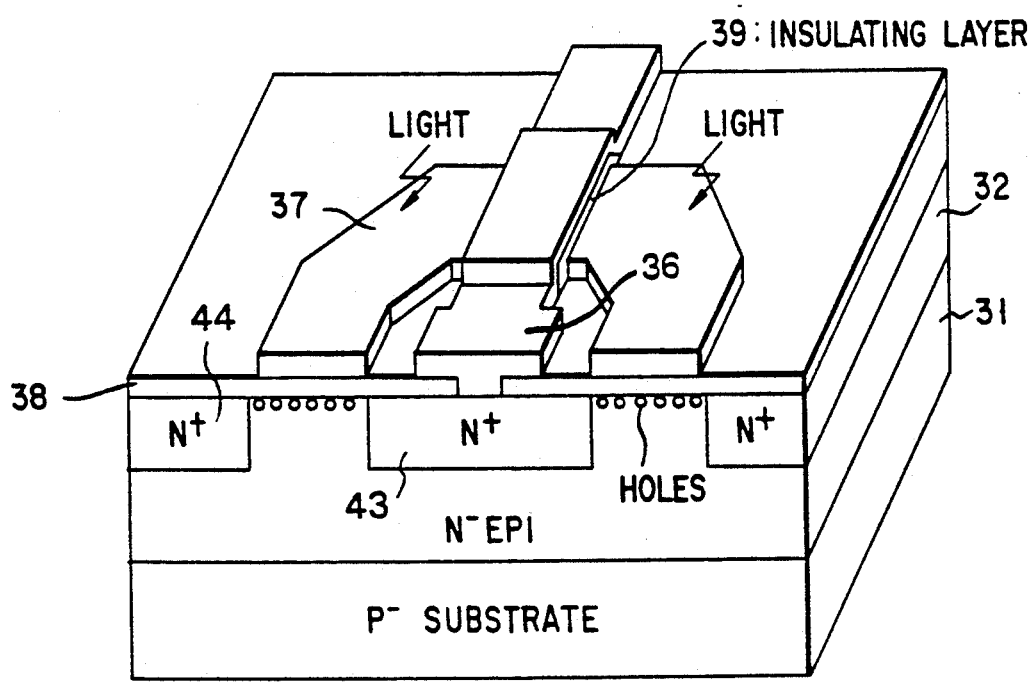
FIG. 12 shows a view of a cross sectional structure of one pixel of a solid-state imaging device relating a third embodiment of the present invention.

In FIG. 12, reference numeral 31 denotes a p- type substrate, 32 denotes an n- type epitaxial layer, 42 denotes an n+ type source region, 44 denotes an n+ type drain region, 36 denotes a source electrode, 37 denotes a gate electrode, 38 denotes an insulating film made of a high dielectric material, and 39 denotes an insulating layer.

The principle of the operation of the present embodiment will be described by using a chart of a potential distribution of FIG. 13.

This is a bulk channel device having a negative threshold voltage. At the time of storing a photocharge, gate electrode 37 is biased by a large negative voltage.

Figure 13:
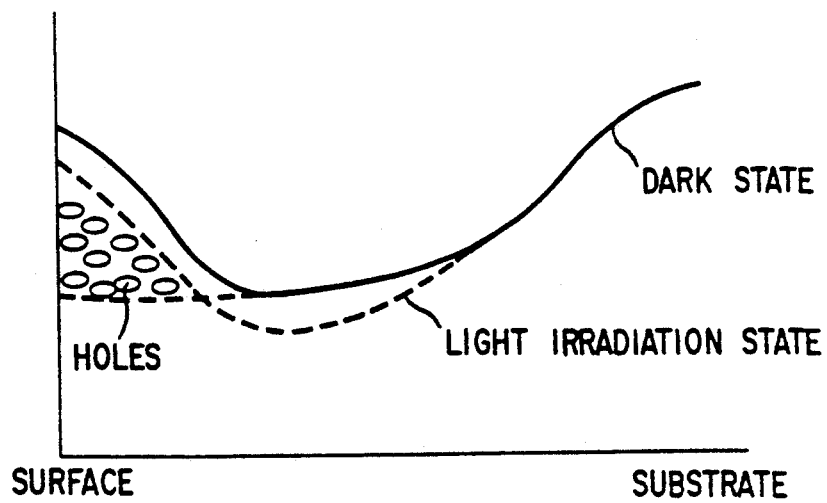
FIG. 13 shows a potential from a gate electrode to a substrate in the pixel shown in FIG. 12.

FIG. 13 shows a potential between the gate electrode 37 and substrate 31, and the state of the stored photocharge (hole).

A hole charge generated by the photoelectric effect is attracted on the field surface of insulating film 38 by a large bias applied to gate electrode 37, and the charge is stored in the field surface. The amount of charge Q stored therein is expressed as the following formula, as a large negative voltage bias applied to gate electrode 37 "Vg", area of gate electrode 37 "Ag", thickness of insulating film 38 "T", and the ratio of the dielectric constant "$\epsilon_1$":

$$Q = \epsilon_0 \epsilon_r Ag/T \cdot Vg$$

In this formula, it is not possible to increase the value of each of Ag and Vg so much. Moreover, there is a limitation to make the thickness T of the insulating layer thin because of pressure, etc. Therefore, it is an inevitable means for increasing the dynamic range to use a material having a large dielectric constant for an insulating film.

In the solid-state imaging element having such a structure, when light forming an image is aimed to the gate portion, a charge occurs in the boundary portion of epitaxial layer 32 and insulating film 38 which are situated under the gate portion, by means of a photoelectric effect. At this time, since gate electrode 37 is biased by a large negative voltage, a positive charge is attracted to the field surface of insulating film 38. In the present embodiment, since insulating film 38 is made of high dielectric material, a large amount of charge can be stored in this insulating film 38.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A solid-state imaging device comprising:
   a semiconductor substrate;
   a plurality of pixels formed on said semiconductor substrate and generating pixel signals; and
   output amplifier means for amplifying a pixel signal generated in each of said pixels to produce an imaging signal, and for outputting said imaging signal;
   said pixels each including:
   (a) a photoelectric converting portion for generating a charge in accordance with an amount of received light, said photoelectric converting portion comprising:
   said semiconductor substrate;
   an n-type source region formed on said substrate; and
   an insulating film formed on an upper surface of said source region, said insulating film being made of a high dielectric material having a high relative dielectric constant;
   (b) a capacitor for storing the charge generated from said photoelectric converting portion, said capacitor comprising;
   a storing region formed on at least one region of a part of said photoelectric converting portion or on adjacent portions of said photoelectric converting portion;
   a capacitor insulating film formed on an upper surface of said storing region, said capacitor insulating film being made of a high dielectric material having a high relative dielectric constant; and
   a capacitor electrode contacting said capacitor insulating film; and
   (c) a switching portion or reading out the charge stored in said capacitor as said pixel signal, said switching portion comprising:
   said semiconductor substrate;
   a further insulating film formed on an upper surface of said substrate and made of a high dielectric constant material having a high relative dielectric constant; and
   a switching electrode formed on said further insulating film and having two electrodes, for reading out a charge stored in said capacitor as said pixel signal;
   wherein said high relative dielectric constant of all of said insulating films is substantially higher than the relative dielectric constant of $SiO_2$.

2. The device according to claim 1, wherein said relative dielectric constant of said capacitor insulating film is at least 3. The device according to claim 2, wherein said high dielectric material of said capacitor insulating film is one selected from the group consisting of $Si_3N_4$, $TiO_2$, $SrTiO_3$, $Pb(Mg_{0.5}W_{0.5})O_3$, and $PbZrO_3$.

4. The device according to claim 1, wherein said relative dielectric constant of said capacitor insulating film is at least 20, said capacitor insulating film being made of a high dielectric material having no remanence.

5. The device according to claim 1, wherein said switching portion includes:
   an n-type source region formed on said semiconductor substrate;
   an n-type drain region formed on said semiconductor substrate spaced apart from said source region;
   said further insulating film of said switching portion being formed on said upper surface of said semiconductor substate and extending over said source region and drain region;
   a gate electrode formed on said further insulating film and arranged between said source region and said drain region; and
   a drain electrode contacted to said drain region through an opening portion of said further insulating film, said drain electrode being positioned on the upper portion of said drain region.

6. The device according to claim 5, wherein said n-type source region of said switching portion serves as said n-type source region of said photoelectric converting portion.

7. The device according to claim 5, wherein a part of said n-type source region also serves as said storing region of said capacitor.

8. The device according to claim 5, wherein said insulating films of said photoelectric converting portion and of said switching portion are made of same high dielectric material formed by a same process as said capacitor insulating film.

9. The device according to claim 1, wherein:
   said plurality of pixels are arranged in a matrix in first and second directions, said matrix including a plurality of lines in both of said first and second directions; and
   said solid-state imaging device further comprises:
   a plurality of horizontal selecting lines connected to pixels which form a plurality of said lines of said matrix in said first direction;
   a plurality of vertical selecting lines connected to pixels which form a plurality of said lines of said matrix in said second direction;
   pixel address means for addressing the pixels by applying a read-out signal to said horizontal and vertical selecting lines, and reading said pixel signal from the addressed pixel; and
   line capacitor means connected to said vertical lines, for storing the pixel signal read out from said pixel, said line capacitor means having a line capacitor insulator made of a high dielectric material having a high relative dielectric constant.

10. The device according to claim 9, wherein:
    said photoelectric converting portion and said switching portion of each of said pixels comprises a static-induced-transistor including a gate terminal connected to a corresponding one of the vertical selecting lines, and a drain terminal to which a predetermined voltage is applied; and
    said static-induced-transistor current-amplifies the pixel signal read out from said capacitor of the pixel, the current-amplified pixel signals then being transferred to said line capacitor means.

11. The device according to claim 10, further comprising:
    a plurality of read-out switches each of which is situated on a read-out side of each of said vertical selecting lines, to which the read out signals are applied from said pixel address means, and which reads out the pixel signal stored in said line capacitor means, and outputs the read out pixel signal to an output amplifier; and
    a plurality of reset switches each of which is situated on a side opposite to the read-out side of each of said vertical selecting lines, said reset switches applying a reset pulse for removing thermal noise in said line capacitor means just before the read out signal is applied to said read-out switches.

12. The device according to claim 9, wherein:
said photoelectric converting portion, said switching portion, and said capacitor of said pixel comprise a MOS transistor including a gate terminal connected to a corresponding one of the horizontal selecting lines through said capacitor of said pixel, a source terminal connected to a corresponding one of the vertical selecting lines, and a drain terminal to which a predetermined voltage is applied; and
the pixel signal read out from said capacitor of said pixel is current-amplified by said MOS transistor, and is transferred to said line capacitor means.

13. The device according to claim 1, wherein said capacitor is formed on said capacitor insulating film.

14. The device according to claim 13, wherein said relative dielectric constant of said capacitor insulating film is at least 15. The device according to claim 14, wherein said high dielectric material of said capacitor insulating film is one selected from the group consisting of $Si_3N_4$, $TiO_2$, $SrTiO_3$, $Pb(Mg_{0.5}W_{0.5})O_3$, and $PbZrO_3$.

16. The device according to claim 13, wherein said relative dielectric constant of said capacitor insulating film is at least 20, said capacitor insulating film being made of a high dielectric material having no remanence.

17. The device according to claim 13, wherein said switching portion includes:
an n-type source region formed on said semiconductor substrate;
an n-type drain region formed on said semiconductor substrate spaced apart from said source region;
said further insulating film of said switching portion being formed on said upper surface of said semiconductor substrate and extending over said source region and drain region;
a gate electrode formed on said further insulating film and arranged between said source region and said drain region; and
a drain electrode contacted to said drain region through an opening portion of said further insulating film, said drain electrode being positioned on the upper portion of said drain region.

18. The device according to claim 17, wherein said n-type source region of said switching portion serves as said n-type source region of said photoelectric converting portion.

19. The device according to claim 17, wherein a part of said n-type source region also serves as said storing region of said capacitor.

20. The device according to claim 17, wherein said insulating films of said photoelectric converting portion and of said switching portion are made of same high dielectric material formed by a same process as said capacitor insulating film.

21. The device according to claim 17, wherein said capacitor electrode is made of a transparent electrode material.

22. The device according to claim 13, wherein said semiconductor substrate has a V-shaped groove formed therein, and said capacitor is formed in the inside of said V-shaped groove of said semiconductor substrate.

23. The device according to claim 13, wherein:
said plurality of pixels are arranged in a matrix in first and second directions, said matrix including a plurality of lines in both of said first and second directions; and said solid-state imaging device further comprises:
a plurality of horizontal selecting lines connected to pixels which form a plurality of said lines of said matrix in said first direction;
a plurality of vertical selecting lines connected to pixels which form a plurality of said lines of said matrix in said second direction;
pixel address means for addressing the pixels by applying a read-out signal to said horizontal and vertical selecting lines, and reading said pixel signal from the addressed pixel; and
line capacitor means connected to said vertical lines, for storing the pixel signal read out from said pixel, said line capacitor means haivng a line capacitor insulator made of a high dielectric material having a high relative dielectric constant.

24. The device according to claim 23, wherein:
said photoelectric converting portion and said switching portion of each of said pixels comprises a static-induced-transistor including a gate terminal connected to a corresponding one of the vertical selecting lines, and a drain terminal to which a predetermined voltage is applied; and
said static-induced-transistor current-amplifies the pixel signal read out from said capacitor of the pixel, the current-amplified pixel signals then being transferred to said line capacitor means.

25. The device according to claim 24, further comprising:
a plurality of read-out switches each of which is situated on a read-out side of each of said vertical selecting lines, to which the read out signals are applied from said pixel address means, and which reads out the pixel signal stored in said line capacitor means, and outputs the read out pixel signal to an output amplifier; and
a plurality of reset switches each of which is situated on a side opposite to the read-out side of each of said vertical selecting lines, said reset switches applying a reset pulse for removing thermal noise in said line capacitor means just before the read out signal is applied to said read-out switches.

26. The device according to claim 23, wherein:
said photoelectric converting portion, said switching portion, and said capacitor of said pixel comprise a MOS transistor including a gate terminal connected to a corresponding one of the horizontal selecting lines through said capacitor of said pixel, a source terminal connected to a corresponding one of the vertical selecting lines, and a drain terminal to which a predetermined voltage is applied; and
the pixel signal read out from said capacitor of said pixel is current-amplified by said MOS transistor, and is transferred to said line capacitor means.

* * * * *